(12) United States Patent
Ogawa et al.

(10) Patent No.: US 7,173,261 B2
(45) Date of Patent: Feb. 6, 2007

(54) IMAGE NOISE REMOVING METHOD IN FIB/SEM COMPLEX APPARATUS

(75) Inventors: Takashi Ogawa, Chiba (JP); Seiji Morita, Chiba (JP)

(73) Assignee: SII NanoTechnology Inc. (JP)

( * ) Notice: Subject to any disclaimer, the term of this patent is extended or adjusted under 35 U.S.C. 154(b) by 0 days.

(21) Appl. No.: 11/059,434

(22) Filed: Feb. 16, 2005

(65) Prior Publication Data
US 2005/0184252 A1 Aug. 25, 2005

(30) Foreign Application Priority Data
Feb. 25, 2004 (JP) .............................. 2004-050465

(51) Int. Cl.
*G21K 5/10* (2006.01)
(52) U.S. Cl. .............................. 250/492.21; 250/492.3; 250/492.1
(58) Field of Classification Search .................... None
See application file for complete search history.

(56) References Cited

U.S. PATENT DOCUMENTS

| | | | | |
|---|---|---|---|---|
| 5,111,043 A | * | 5/1992 | Shigenaka et al. | 250/306 |
| 6,465,781 B1 | * | 10/2002 | Nishimura et al. | 250/306 |
| 2002/0066863 A1 | * | 6/2002 | Chao et al. | 250/397 |
| 2004/0129351 A1 | * | 7/2004 | Iwasaki | 148/508 |

FOREIGN PATENT DOCUMENTS

| JP | 09-274883 | * | 10/1997 |
|---|---|---|---|
| JP | 11-317434 | * | 11/1999 |

* cited by examiner

Primary Examiner—Nikita Wells
Assistant Examiner—Anthony Quash
(74) Attorney, Agent, or Firm—Adams & Wilks

(57) ABSTRACT

In an image noise prevention method in a composite system of a scanning electron microscope (SEM) and a focused ion beam apparatus (FIB), noise generated during a blanking period of the FIB is prevented from entering an image generated by the SEM by adjustment of scanning cycles of the FIB and the SEM.

4 Claims, 7 Drawing Sheets

CASE IN WHICH FIB/SEM SCANNING CYCLES ARE DIFFERENT $I_{FIB} < 2 \times I_{SEM}$

WHEN $I_{SEM}$ BECOMES LARGE
⇒ RESOLUTION IS DETERIORATED

FIB MACHINING, SEM BLANKING

SEM OBSERVATION, FIB BLANKING

IMAGE NOISE REMOVING METHOD IN FIB/SEM COMPLEX APPARATUS

BACKGROUND OF THE INVENTION

The present invention relates to an improvement of a composite system (hereinafter "complex apparatus") that can observe a sample with a scanning electron microscope (SEM) on a real time basis while machining the sample with a focused ion beam apparatus (FIB). The present invention also relates to an image noise removing or preventing method in the FIB/SEM complex apparatus.

There has already been publicly known a so-called double lens-barrel FIB system that is provided with an electron lens-barrel separately to have an observation function by an SEM in order to observe a machining state of a sample in applying etching and CVD to the sample with an FIB apparatus. In addition to functions for performing the etching and the CVD, the FIB apparatus includes a function as an ion microscope for detecting a secondary charged particle such as an electron or an ion emitted from a sample surface by ion irradiation and imaging an amount of the detection in association with an irradiation position. In response to needs for an observation of a sectional structure at a desired point of a semiconductor wafer, an LSI device, or the like, a conventional FIB apparatus has been used in a form of drilling a sample from a position above a sample surface with etching by FIB irradiation and inclining a sample stage to observe a cross-section of the sample. However, in this case, work of machining and observing a state of the machining has to be carried out repeatedly. Since an irradiation angle of an FIB has to be changed for the machining and the observation, the sample stage has to be moved every time the machining and the observation are performed. Therefore, there has been proposed a system in which two lens-barrels are arranged at different angles with respect to a sample surface to perform machining with one lens-barrel and perform a microscope observation with the other lens-barrel such that the processing and the microscope observation are performed by different beam irradiations. As a basic structure of the system, as shown in FIG. 9, an FIB lens-barrel 1 and an SEM lens-barrel 2 are fixed to a sample stage in an evacuated chamber 3 at different angles, blanking electrodes for switching and controlling beam irradiation are provided in the respective lens-barrels, and a secondary electron detector 4 is set near the sample stage. For example, a section machining observation apparatus described in a patent reference 1 has an object of solving problems in that operation is troublesome because the apparatus has to be moved between a machining angle (usually, horizontal) and an observation angle (about 45 to 60 degrees) several times, a mechanical error involved in movement of a sample occurs, and it is likely that a very small foreign matter or an abnormal shape is overlooked because a section cannot be seen during machining. In order to solve the problems, the apparatus of the invention described in the patent reference 1 includes an ion beam irradiation system and an electron beam irradiation system that irradiate beams on a sample surface to scan the sample surface, a detector that captures a secondary electron emitted from the sample at the time of irradiation of the respective beams, an image display device 6 that displays a SEM image 13 and/or an FIB image 14 based on an output of the detector, and a beam switch. The ion beam irradiation system and the electron beam irradiation system are arranged at an angle of 90 degrees or an angle narrower than 90 degrees from each other in irradiation axes thereof and are mounted in an identical sample chamber such that an ion beam and an electro beam can be irradiated at an identical point on the sample to scan the sample. FIG. 7A shows a form in which an electron beam of an SEM is blanked by blanking electrode 11 and an FIB is irradiated on a sample 10 and FIG. 7B shows a form in which an FIB is blanked by blanking electrode 12 and an electron beam of an SEM is irradiated on a sample 10. In this way, the beam switch alternately switches the ion beam and the electron beam, and the image display device 6 displays outputs of the detector 4 as a sample 10 surface image and a section machining image according to a switching operation of the switch.

According to the double lens-barrel FIB system described above, since it is unnecessary to perform inclined movement of the sample stage at the time of machining and at the time of a microscope observation, the double lens-barrel FIB system is advantageous in terms of trouble of operation and a mechanical error involved in the movement of a sample in the past. However, when it is attempted to perform a cross-section observation with the SEM during machining by the FIB, a secondary electron involved in the FIB irradiation is mixed in an SEM detection signal and becomes noise. In this phenomenon, for example, when it is attempted to drill a rectangular hole with FIB etching to observe a cross-section, the FIB is used to scan a rectangular area of the sample in a raster shape to machine the rectangular area. A secondary electron emitted from a sample surface by the beam irradiation is detected by the secondary electron detector. A signal wave form of this secondary electron changes according to a beam irradiation position as indicated as an FIB signal in FIG. 8. In addition, a secondary electron detection signal involved in the electron beam irradiation, which an operator desires to detect as a microscope image, is indicated as an SEM signal in FIG. 8. However, when it is attempted to perform an SEM observation in parallel at the time of the FIB machining, the FIB signal and the SEM signal are superimposed to be a secondary electron detection signal. The secondary electron detection signal changes as indicated as a signal at the time of FIG/SEM simultaneous irradiation in FIG. 8, and an image is disturbed by noise.

[Patent reference 1] JP-A-2-123749 "Section machining observation apparatus", published on May 11, 1990, page 2 and FIG. 3.

A problem that the invention is to solve resides in providing a system including an FIB lens-barrel and an SEM lens-barrel in which, when a process of executing FIB machining is observed by an SEM on a real time basis, an influence of a secondary electron excited by FIB irradiation does not appear as noise in an SEM detection signal.

SUMMARY OF THE INVENTION

An image noise removing method in an FIB/SEM complex apparatus of the invention adopts a method in which a secondary electron detection signal in an FIB blanking period does not affect pixels of an SEM image. In the image noise removing method, FIB blanking period noise is excluded from the SEM image by adjusting one-dot irradiation time of an SEM to one-line scanning time of an FIB, adjusting one-line scanning time of the SEM to one-line scanning time of the FIB, or adjusting one-frame scanning time of the SEM to one-line scanning time of the FIB.

An FIB/SEM complex apparatus of the invention includes: a unit that detects a secondary electron detection signal level change in an FIB blanking period and stores a value of the change; and a unit that superimposes the amount of the stored level change on a secondary electron detection signal in the FIB blanking period. Consequently, the FIB/SEM complex apparatus has a function of removing FIB blanking period noise from an image.

Another FIB/SEM complex apparatus of the invention includes: a unit that acquires plural SEM images and stores the SEM images; a unit that extracts an FIB blanking period noise area in one SEM image; a unit that slices image information of the area from other SEM images, and a unit that replaces image information in the FIB blanking period noise area with the sliced image information. Consequently, the FIB/SEM complex apparatus has a function of removing an FIB blanking period noise in an image from the image.

Still another FIB/SEM complex apparatus of the invention includes: a storage medium that stores optimum current ratio value data obtained by testing SEM resolution characteristics with respect to SEM current/FIB current values, charge-up characteristics by charged particle irradiation, and FIB noise characteristics for each type of a sample in advance; and a unit that calculates an optimum current value of an SEM on the basis of information in the storage medium when specific information of the sample, a current value and scanning speed of an FIB, and scanning speed information of the SEM are set and inputted. Consequently, the FIB/SEM complex apparatus has a function of, upon receiving the condition setting, calculating an electron beam current value for reducing FIB noise and automatically setting the electron beam current value in the SEM.

Still another FIB/SEM complex apparatus of the invention includes: a storage medium that stores optimum current ratio value data obtained by testing FIB noise characteristics in an SEM image with respect to SEM scanning speed/FIB scanning speed for each type of a sample in advance; and a unit that calculates optimum scanning speed of an SEM on the basis of information in the storage medium when specific information of a sample and scanning speed information of an FIB are set and inputted. Consequently, the FIB/SEM complex apparatus has a function of, upon receiving the condition setting, calculating scanning speed of the SEM for reducing FIB noise and automatically setting the scanning speed in the SEM.

DETAILED DESCRIPTION OF THE PREFERRED EMBODIMENTS

In the image noise removing method in the FIB/SEM complex apparatus of the invention, one-dot irradiation time of an SEM is adjusted to one-line scanning time of an FIB. Thus, FIB blanking period noise is superimposed on respective pixels of an SEM image equally and it is possible to remove an influence of the FIB blanking period noise.

In addition, in another image noise removing method in the FIB/SEM complex apparatus of the invention, one-line scanning time of an SEM is adjusted to one-line scanning time of an FIB. Thus, FIB blanking period noise synchronizes with a blanking period of the SEM and the FIB blanking period noise never appears in an SEM image.

Further, in the still another image noise removing method in the FIB/SEM complex apparatus of the invention, one-frame scanning time of an SEM is adjusted to one-line scanning time of an FIB. Thus, FIB blanking period noise synchronizes with a vertical blanking period of an SEM image and the FIB blanking period noise never appears in the SEM image.

The FIB/SEM complex apparatus of the invention includes: a unit that detects a secondary electron detection signal level change in an FIB blanking period and stores a value of the change; and a unit that superimposes the amount of the stored level change on a secondary electron detection signal in the FIB blanking period. Thus, it is possible to add an amount of a secondary electron emitted by an FIB blanked in the FIB blanking period and remove noise from an image more effectively.

In addition, the another FIB/SEM complex apparatus of the invention includes: a unit that acquires plural SEM images and stores the SEM images; a unit that extracts an FIB blanking period noise area in one SEM image; a unit that slices image information of the area from other SEM images, and a unit that replaces image information in the FIB blanking period noise area with the sliced image information. Thus, it is possible to slice FIB blanking period noise in one SEM image from another image in which the area is not noise and synthesize the FIB blanking period noise with the image and remove noise from an image more effectively.

The still another FIB/SEM complex apparatus of the invention includes: a storage medium that stores optimum current ratio value data obtained by testing SEM resolution characteristics with respect to SEM current/FIB current values, charge-up characteristics by charged particle irradiation, and FIB noise characteristics for each type of a sample in advance; and a unit that calculates an optimum current value of an SEM on the basis of information in the storage medium when specific information of the sample, a current value and scanning speed of an FIB, and scanning speed information of the SEM are set and inputted. Thus, it is possible to reduce FIB noise on the basis of a database in which the condition setting is inputted on a system, calculate an optimum electron beam current value with charge-up controlled relatively low without declining a resolution significantly, and automatically set the electron beam current value in the SEM to obtain an optimum image.

The still another FIB/SEM complex apparatus of the invention includes: a storage medium that stores optimum scanning speed ratio value data obtained by testing FIB noise characteristics in an SEM image with respect to SEM scanning speed/FIB scanning speed for each type of a sample in advance; and a unit that calculates optimum scanning speed of an SEM on the basis of information in the storage medium when specific information of a sample and scanning speed information of an FIB are set and inputted. Thus, it is possible to calculate scanning speed of an SEM for reducing FIB noise on the basis of a database in which the condition setting is inputted on a system and automatically set the scanning speed in the SEM to reduce image noise effectively.

DETAILED DESCRIPTION OF THE INVENTION

Figure 1:
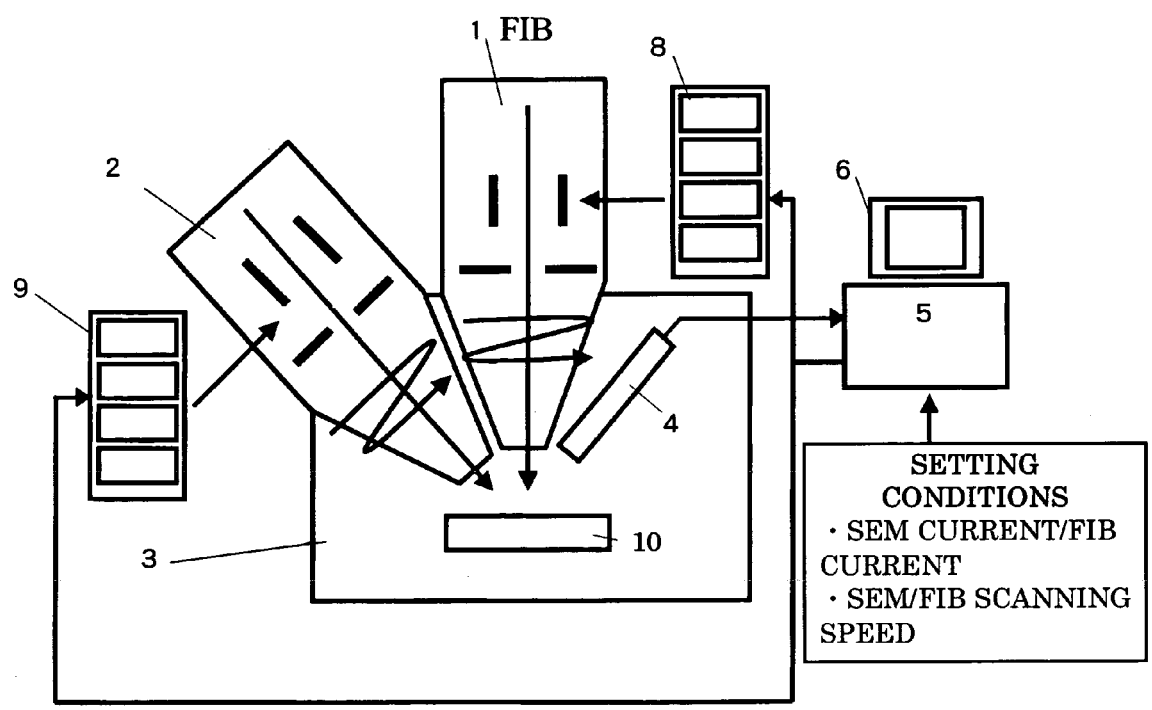
FIG. 1 is a diagram showing a basic structure of a complex apparatus and a noise removing method of the invention.

FIG. 1 is a diagram showing a basic structure of a complex apparatus and a noise removing or preventing method of the invention. FIB lens-barrel 1 or SEM lens-barrel 2 irradiates sample 10 that is disposed in chamber 3. FIB power supply 8 or SEM power supply 9 supplies power to FIB lens-barrel 1 or SEM lens-barrel 2 respectively. Secondary electron detector 4 detects secondary electrons generated from sample 10 subjected to FIB or SEM. The detected secondary electrons are changed to electric signals and outputted to computer 5. Computer 5 processes the electric signals and transfers image signal to display 6. Computer 5 also sets conditions such as SEM current/FIB current and SEM/FIB scanning speed.

Figure 6:
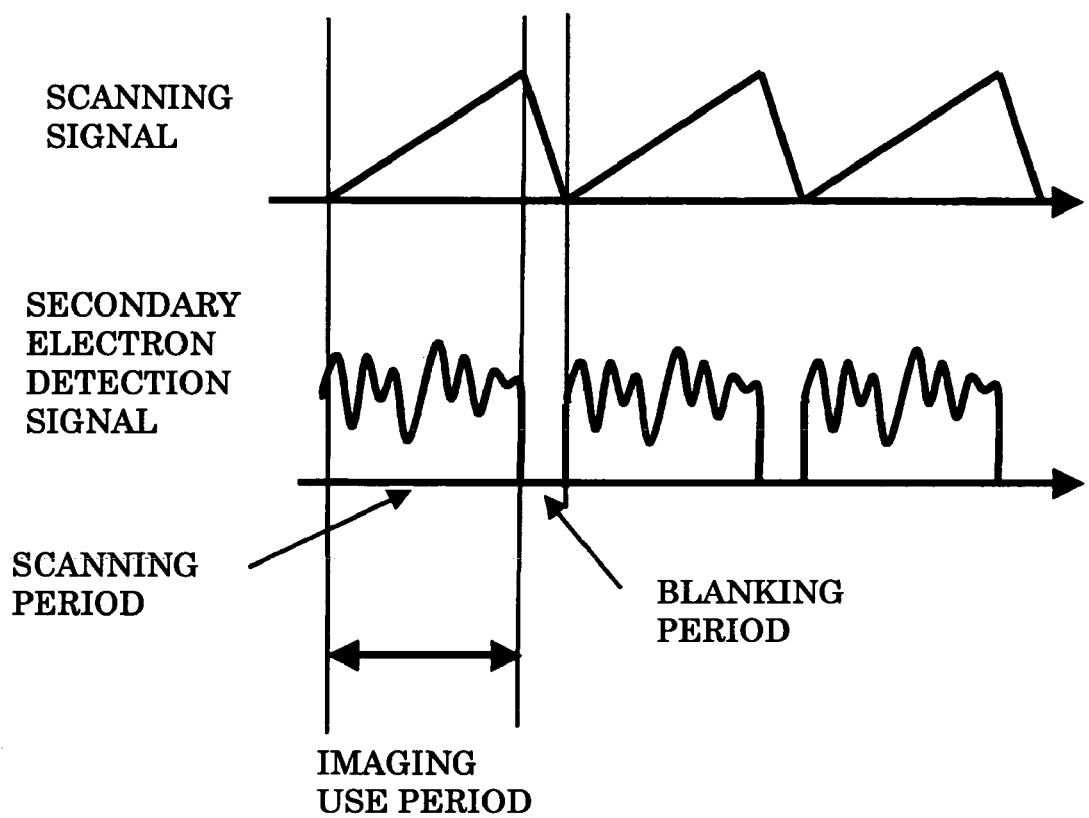
FIG. 6 is a diagram explaining a relation between beam scanning and image information of a scanning charged particle microscope.
Figure 7A:
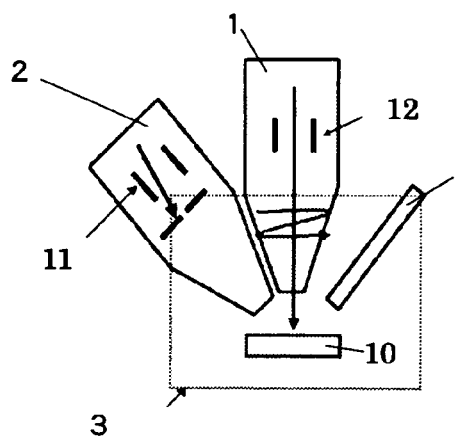
FIGS. 7A and 7B are diagrams explaining, using blanking electrodes, a state of switching for operations in an FIB/SEM complex apparatus.
Figure 7B:
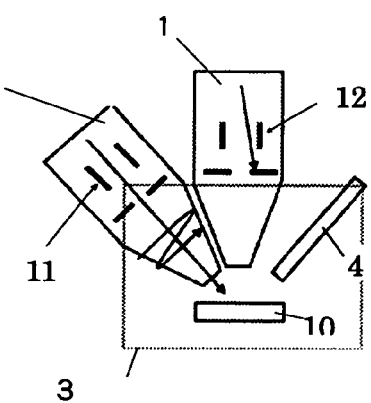
Figure 8:
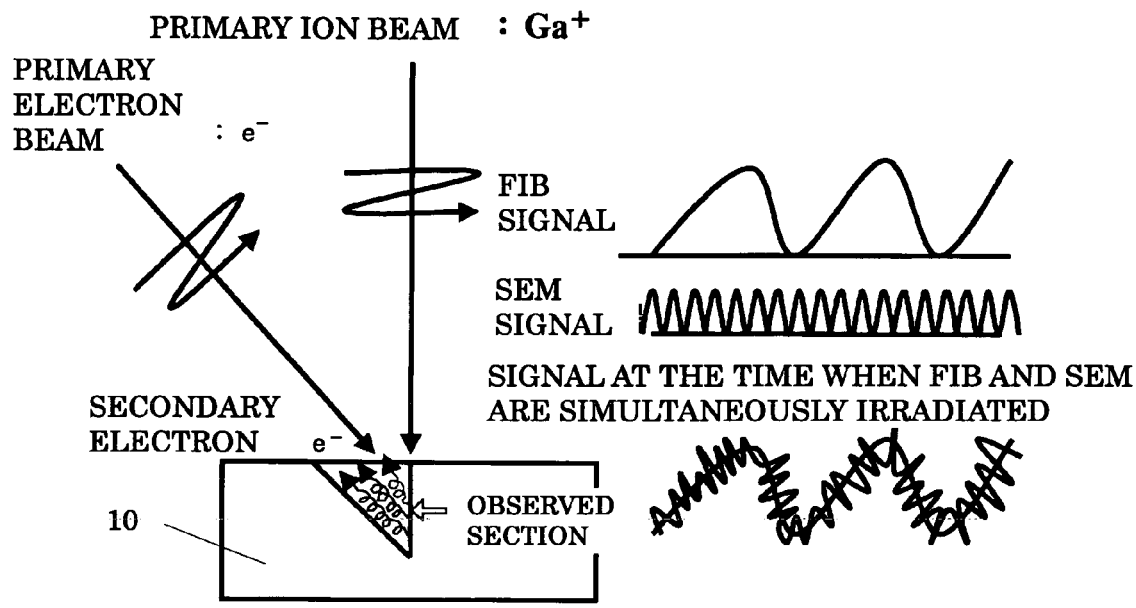
FIG. 8 is a diagram showing a secondary electron detection signal at the time when an electron and an ion are irradiated simultaneously in the FIB/SEM complex apparatus.
Figure 9:
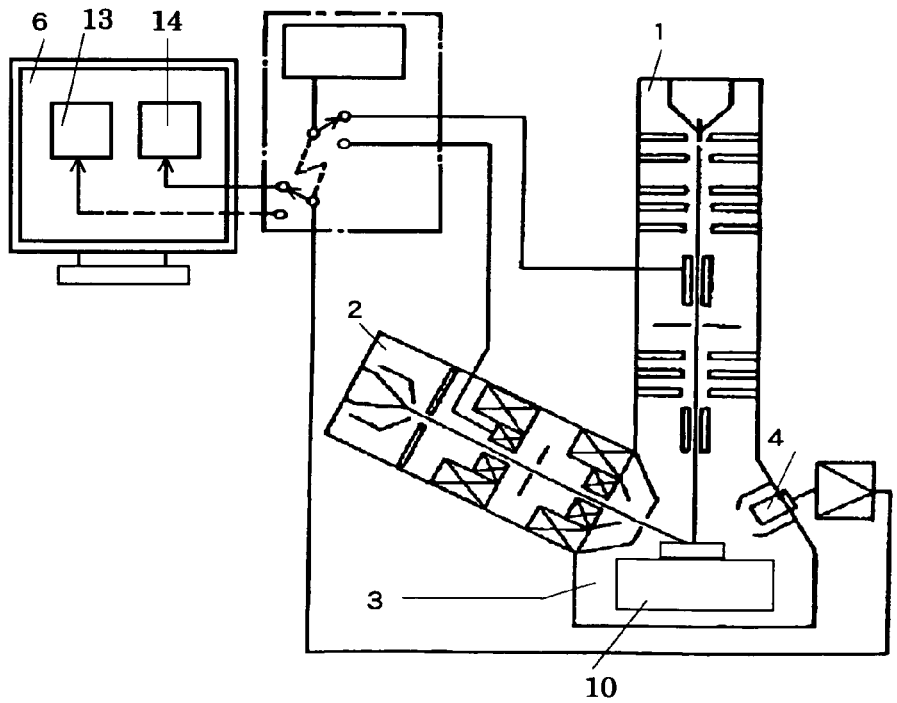
FIG. 9 is a diagram showing a basic structure of a conventional FIB-SEM complex apparatus.

Concerning a problem in that, when SEM observation is performed during operation of an FIB apparatus, a secondary electron due to FIB irradiation from FIB lens barrel 1 is mixed in an SEM image on display 6 as noise, a phenomenon related to the problem will be examined. In order to drill a rectangular hole with FIB etching for cross-section observation, when it is attempted to use an FIB to scan the rectangular area in a raster shape and machine the rectangular area and observe a state of the area with an SEM, noise of a horizontal stripe shape may appear periodically in an SEM image. The inventors have recognized that this noise phenomenon is caused by blanking of an FIB at the time when a horizontal blanking period intervenes in a one-frame scanning period of the SEM. Whether a scanning charged particle microscope is an SEM or a scanning ion microscope (SIM), the scanning charged particle microscope performs beam scanning in a raster shape on an observed area, detects a secondary electron excited at the time of beam irradiation, and sets a level of detection as a luminance of a pixel to form the level as an image in association with a beam irradiation position. Therefore, in each horizontal scanning, as shown in an upper half in FIG. 6, a horizontal scanning signal is applied to a deflection device of a microscope and a horizontal scanning period and a blanking period, in which a beam irradiation position is returned to an original position, are repeated. A charged particle beam is irradiated on a sample surface in the horizontal scanning period and is blocked in the blanking period. Thus, the secondary electron is detected in the horizontal scanning period but is not detected in the blanking period as shown in a lower half in the figure. Then, a microscope image is created by a detection signal detected in the horizontal scanning period. When scanning (one-frame scanning) is completed for all horizontal lines, a beam irradiation position jumps from the end of a bottom line to an end of a top line. This is the vertical blanking period in which irradiation of a beam is also blocked.

Figure 2:
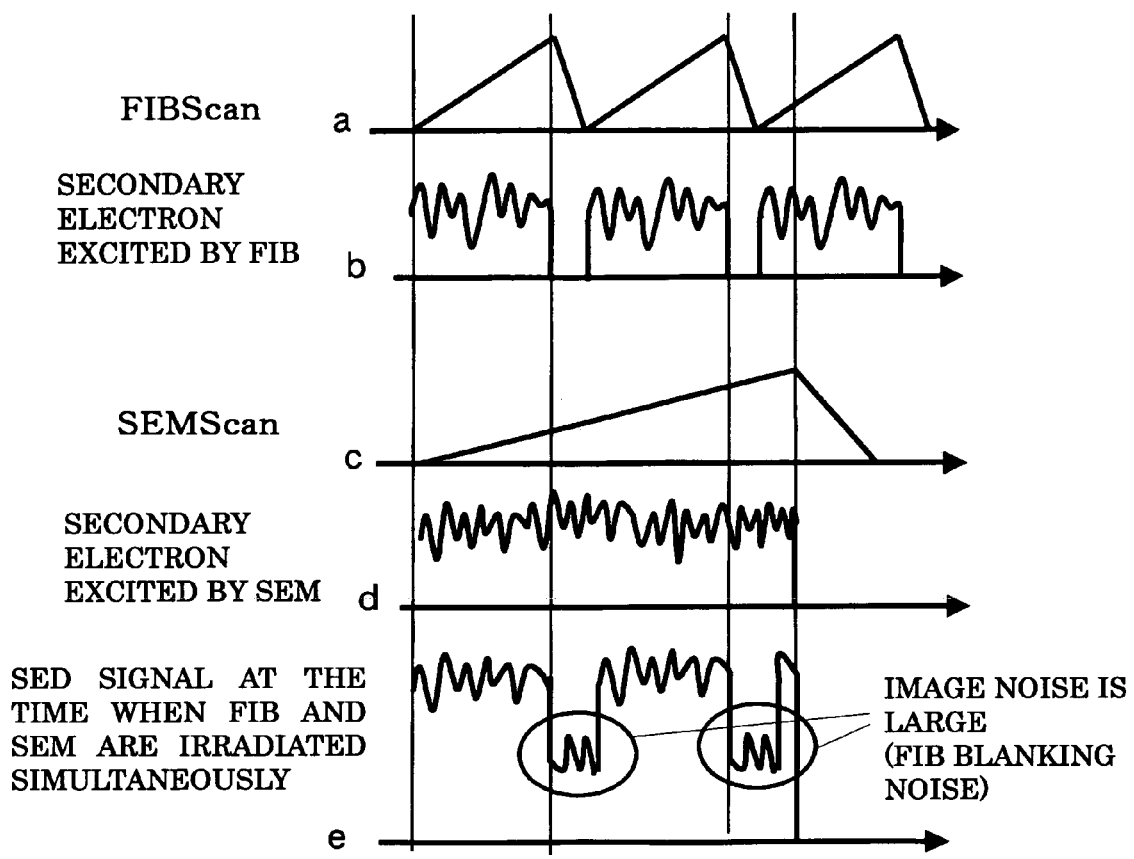
FIG. 2 is a diagram explaining FIB blanking noise appearing in an SEM image.

In the FIB/SEM complex apparatus, the FIB lens-barrel and the SEM lens-barrel perform the beam scanning described above independently. When it is assumed that one-frame scanning of an FIB is performed at a cycle indicated by "a" in FIG. 2 and an electron beam of an SEM is irradiated at a cycle indicated by "c" in FIG. 2, an amount of a secondary electron excited by FIB irradiation is as indicated by "b" in FIG. 2. The secondary electron is detected in the scanning period but is not detected in the blanking period. On the other hand, although an amount of a secondary electron excited by electron beam irradiation is as indicated by "d" in FIG. 2 and is also detected in the scanning period but is not detected in the blanking period, since the cycles of the periods are different, two FIB vertical blanking periods are included in one-frame scanning of the SEM in the case. The secondary electron detector in this case detects a secondary electron excited by an FIB and a secondary electron excited by an electron beam as indicated by "e" in FIG. 2. Since FIB irradiation is blanked in the blanking period of the FIB, a signal level falls in that period and two dark horizontal stripes appear in an SEM image. The number and positions of stripes change depending on scanning cycles of the SEM and the FIB and image pickup timing.

Here, the problem is explained as a problem of one-frame cycles of the SEM and FIB. However, actually, the same phenomenon occurs in each line scanning. In other words, several dark areas are included in one line of an SEM image. However, in the next line, in general, since the dark areas are in positions different in a horizontal direction, the dark areas never appear as clear stripe patterns. The dark areas deteriorate an image as image noise dispersed in the entire image.

Figure 3:
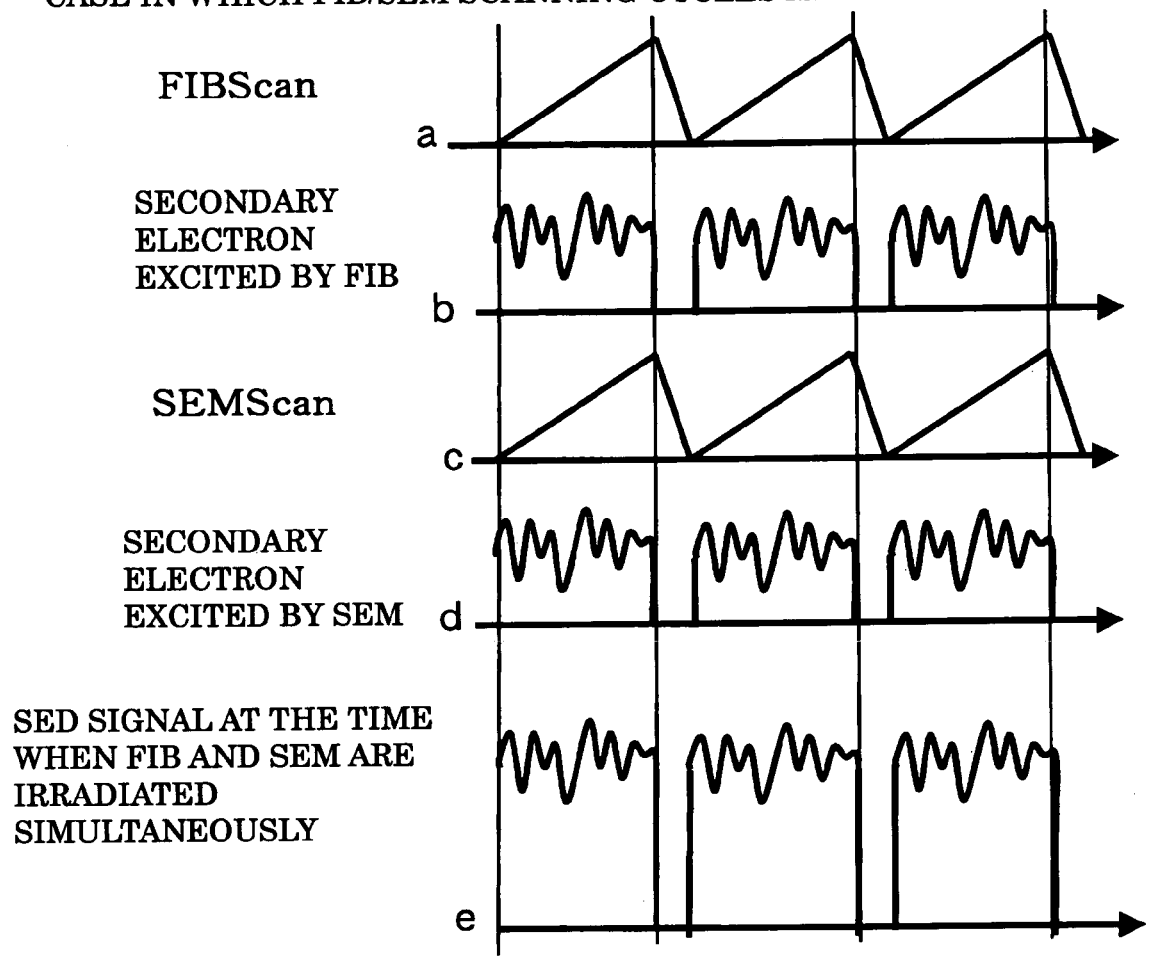
FIG. 3 is a diagram explaining a first method of the invention for excluding FIB blanking noise from an SEM image.

The invention solves this problem by preventing fluctuation in an amount of a secondary electron detected call, which changes in a blanking period of an FIB, from affecting an SEM image. As a first method, taking into account the fact that the problem is caused by a difference of a scanning cycle of an FIB and an SEM, the inventors has reached an idea that, if both the scanning cycles are set to be the same and synchronized, blanking periods of the FIB and the SEM always match with each other and the other blanking period never intervenes in an image that uses only information during a scanning period. As shown in FIG. 3, FIB scanning is performed as indicated by "a" in FIG. 3 and scanning of the SEM is performed in synchronization with the FIB scanning as indicated by "c" in FIG. 3. Then, a secondary electron signal excited by the FIB is as indicated by "b" in FIG. 3 and a secondary electron signal excited by an electron beam of the SEM is as indicated by "d" in FIG. 3. Therefore, a signal detected by the secondary electron detector is as indicated by "e" in FIG. 3 and image noise never appears.

Realization of the method of the invention for preventing noise of an FIB blanking period from entering an SEM image by adjusting the scanning cycles of the FIB and the SEM is not limited to the example of the perfect match described above. There are three forms of the method as shown in Table 1 below.

TABLE 1

Conditions for FIB/SEM scanning cycles

| | SEM | FIB |
|---|---|---|
| (1) | one-dot time = | one-line cycle |
| (2) | one-line cycle = | one-line cycle |
| (3) | one-frame cycle = | one-line cycle |

The example of the perfect match described above corresponds to (2).

In (1) of table 1, a scanning period of one line of the FIB is made equal to a period in which an electron beam is retained in one dot in SEM scanning. In this case, a blanking period of the FIB is included in an SEM image acquisition period. However, since the FIB blanking period affects all pixels equally, FIB blanking noise never becomes noise on an image.

In (3) of table 1, a one-frame cycle of the SEM is made equal to a one-line cycle of the FIB. In this case, as in the example described above in which the SEM scanning cycle and the FIB scanning cycle are made completely identical, a blanking period of the FIB is not included in an SEM image acquisition period. Therefore, FIB blanking noise never becomes noise on an image. In this FIB/SEM apparatus, in which machining by the FIB is often observed by the SEM, since an FIB scanning cycle depends on machining conditions, it is possible to select an SEM scanning cycle from the three forms described above according to a quality and conditions of an image that an operator desires to observe.

In a second method of the invention for removing FIB blanking noise, paying attention to the fact that blanking period noise appears regularly, it is attempted to apply noise compensation in a form of signal processing. A secondary electron signal excited by an FIB has its own waveform in a scanning period of the FIB and falls to zero in a blanking period because ion irradiation is blocked. Since such a signal is detected by a secondary electron detector together with a secondary electron excited by an SEM, as it is evident from "e" in FIG. 2, signal levels at two points appear in an SEM image to be lower by a predetermined amount corresponding to the blocking of the FIB. In other words, on the basis of the fact that this noise is equivalent to an amount of decrease of an excited secondary electron due to the FIB block that is performed in the FIB blanking period, this second method is realized by performing signal processing of adding this amount of decrease to a signal of the secondary electron detector in this FIB blanking period as a bias component. Since a signal of the SEM has been detected in the secondary electron detection signal in the FIB blanking period, a signal equivalent to the FIB blanking is superimposed on the signal of the SEM as a bias component, whereby the signal of the SEM is utilized effectively as an image signal Next, a third method of the invention for removing FIB blanking noise will be explained. In a state in which a scanning cycle of an SEM and a scanning cycle of an FIB are different, in general, a position of FIB blanking noise appearing in an SEM image is different in plural SEM frame images obtained by scanning that is performed plural times. In the third method of the invention, attention is paid to this fact. The method is a method of cutting an area where FIB blanking noise appears in one SEM image, when the FIB blanking noise appears in another area, extracting image information of the area from other SEM images in which noise is not appeared, and synthesizing one SEM image, in which the FIB blanking noise does not appear, by replacing cut original information with the extracted image information. Since the FIB blanking noise always occurs in a blanking period of the FIB, it is possible to detect scanning timing on the FIB side and specify an irradiation position of an electron beam on the SEM side at the timing. An image signal in the area is replaced with image information of other SEM images that are not in the FIB blanking period. It is possible to easily specify an area on a machine.

Figure 4A:
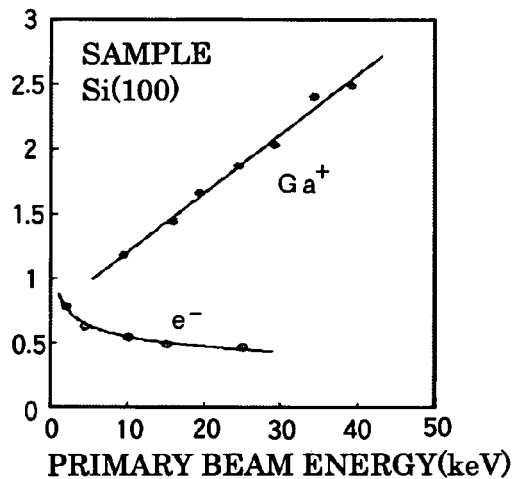
FIG. 4A is a diagram showing secondary electron generation efficiency of an SEM and an FIB and FIG. 4B is a diagram explaining a relation between an electron beam current and a beam diameter.

Incidentally, a measure against FIB blanking noise in an SEM image can be taken by the method described above. However, since an FIB is irradiated simultaneously in parallel during SEM observation, the secondary electron detector detects both excited secondary electrons, and information on a secondary electron excited by the FIB is inevitably superimposed on an SEM observation image signal. This is also image noise in view of the SEM image. When efficiency of generation of a secondary electron excited by an electron beam of the SEM and a secondary electron excited by the FIB was examined, a result shown as a graph of FIG. 4A was obtained. This graph shows efficiency of generation of a secondary electron generated by a primary electron beam and a secondary electron generated by a gallium ion primary beam at the time when Si (100) was used as a sample. In the case of the electron beam, the efficiency is about 0.8 at low energy of about 2 keV. However, the efficiency is about 0.55 at 10 keV, about 0.5 at 15 keV, and about 0.45 at 30 keV or less. These values are within a fixed value. In the case of the FIB, the efficiency shows a value of about 1 at 5 keV, about 1.64 at 20 keV, about 2.1 at 30 keV, and about 2.5 at 40 keV. Thus, the efficiency shows a simple increasing tendency substantially linearly. It is seen from this fact that an electric current twice or more as large as that of a gallium ion beam is necessary in the case of the electron beam in order to obtain an image of the same brightness.

Figure 4B:
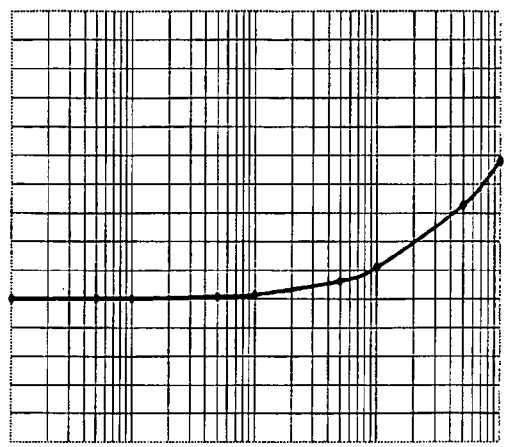

In addition, a relation between a current value and image resolution in an SEM is shown as a graph of FIG. 4B. As it is seen from this graph, there is no large change in the resolution up to a certain value of a beam current, but a beam diameter tends to increase in a form of a quadratic curve when the beam current exceeds the value. It is seen that the resolution deteriorates when the beam current is set large. Taking into account the fact that a charge phenomenon on a sample surface occurs when an electric current is increased, a current value of an electron beam cannot be set too large.

Figure 5:
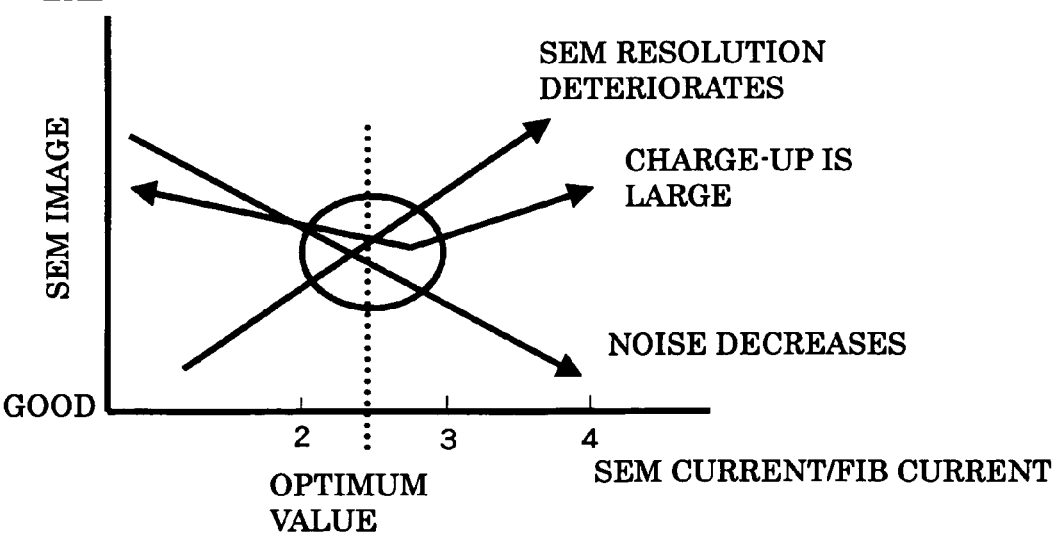
FIG. 5 is a conceptual diagram of conditions for finding an optimum value of an SEM/FIB current ratio.

On the basis of these tendencies of the phenomena, it is possible to conceptually grasp an optimum value of an SEM current/FIB current ratio as shown in FIG. 5. In order to reduce an influence of an FIB that becomes noise on an SEM image, basically, an SEM current only has to be set larger than an FIB current. However, SEM resolution tends to deteriorate as this current ratio increases. Concerning the problem of charge-up, the charge-up decreases up to a certain value and shows an optimum value and, when the value is exceeded, tends to deteriorate again. When these phenomena are taken into account, it is preferable to set an SEM current two to three times as large as an FIB current.

Incidentally, this kind of SEM/FIB complex apparatus is generally used for performing machining with the FIB and observing a state of the machining with the SEM. Thus, when an SEM current/FIB current ratio is actually determined, an FIB suitable for machining to be performed is set and, when a state of the machining is observed by the an SEM, SEM setting capable of reducing an influence of noise due to the FIB on an image of the SEM is performed. The invention provides a system for supporting allocation of setting conditions for an SEM such that an optimum SEM current is obtained for each current condition of an FIB.

First, SEM resolution characteristics with respect to SEM current/FIB current ratio values, charge-up characteristics by charged particle irradiation, and FIB noise characteristics are tested for each type of a sample to be an object in advance to accumulate data, and optimum SEM current value data with respect to an FIB current value to be used is calculated on the basis of the data. The support system of the invention stores the optimum SEM current value data with respect to the FIB current value in a storage medium and sets the storage medium in a computer 5. When specific information of a sample, a current value and scanning speed of an FIB, and scanning speed information of the SEM are set and inputted, the support system of the invention sets an FIB apparatus and an SEM apparatus according to designated conditions, accesses the storage medium to read out an optimum SEM current value under the conditions, and automatically sets the optimum SEM current value in the SEM.

In addition, when an SEM scanning speed/FIB scanning speed ratio is determined in the same manner, an FIB suitable for machining to be performed is set and, when a state of the machining is observed by an SEM, SEM setting capable of reducing an influence of noise due to the FIB on an image of the SEM is performed. The invention provides a system for supporting allocation of setting conditions for an SEM such that an optimum SEM current is obtained for each current condition of an FIB.

FIB noise characteristics in SEM with respect to a SEM scanning speed/FIB scanning speed ratio are tested for each type of a sample to be an object in advance to store data, and an optimum SEM scanning speed value data with respect to FIB scanning speed to be used is calculated on the basis of the data. The support system of the invention stores the optimum SEM scanning speed value data with respect to the FIB scanning speed in a storage medium and sets the storage medium in a computer 5. When specific information of a sample and scanning speed of an FIB are set and inputted, the support system of the invention sets an FIB apparatus and an SEM apparatus according to designated conditions, accesses the storage medium to read out an optimum SEM scanning speed under the conditions, and automatically sets the optimum SEM scanning speed in the SEM.

What is claimed is:

1. An image noise prevention method in a composite system of a scanning electron microscope (SEM) and a focused ion beam apparatus (FIB), comprising the step of: adjusting scanning cycles of the FIB and the SEM to prevent image noise generated during a blanking periods of the FIB from entering an image generated by the SEM.

2. An image noise prevention method according to claim 1; wherein the adjusting step comprises the step of adjusting a one-dot irradiation time of the SEM to a one-line scanning line of the FIB.

3. An image noise prevention method according to claim 1; wherein the adjusting step comprises the step of adjusting the scanning cycles of each of the SEM and the FIB so that the scanning cycles of the SEM perfectly match the respective scanning cycles of the FIB.

4. An image noise prevention method according to claim 1; wherein the adjusting step comprises the step of adjusting the scanning cycles of each of the SEM and the FIB so that the scanning cycles of the SEM are synchronized with the respective scanning cycles of the FIB.

* * * * *